United States Patent [19]

Beat

[11] Patent Number: 5,606,584
[45] Date of Patent: Feb. 25, 1997

[54] TIMING CIRCUIT

[75] Inventor: Robert Beat, Bristol, United Kingdom

[73] Assignee: SGS-Thomson Microelectronics Limited, Bristol, United Kingdom

[21] Appl. No.: 519,314

[22] Filed: Aug. 25, 1995

[30] Foreign Application Priority Data

Aug. 26, 1994 [GB] United Kingdom .................. 9417270

[51] Int. Cl.$^6$ .................................................. G06M 3/00
[52] U.S. Cl. .................................................. 377/26; 377/77
[58] Field of Search .................................. 377/26, 77

[56] References Cited

U.S. PATENT DOCUMENTS

| 3,896,388 | 7/1975 | Hatsukano et al. | 328/63 |
| 5,073,909 | 12/1991 | Kotzin et al. | 377/72 |
| 5,090,035 | 2/1992 | Murase | 377/72 |

FOREIGN PATENT DOCUMENTS

| 2633742 | 1/1990 | France | G06F 1/04 |

OTHER PUBLICATIONS

Hack, G. E., "Universal Counter Function Utilizing A Shift Register Latch String," *IBM Technical Disclosure Bulletin*, 27:1A, Jun., 1984, pp. 181–182.

Holdsworth, B. et al., "More shift registers—ring counters and maximum-length sequence generators," *Wireless World* 83:1053, Nov., 1977, pp. 72–76.

Argytoudis, P. et al., "Shift-register applications reach gigahertz range," *EDN Electrical Design News* 32:11, May 28, 1987, pp. 195–200.

Tokarnia, A., "Minimal Shift Counters and Frequency Division," *30th ACM/IEEE Design Automation Conference*, Jun. 1993, Dallas, Texas, pp. 19–24.

Clark, D. W. et al., "Maximal and Near-Maximal Shift Register Sequences: Efficient Event Counters and Easy Discrete Logarithms," *IEEE Transactions On Computers*, 43:5, May, 1994, pp. 560–567.

*Primary Examiner*—Margaret Rose Wambach
*Attorney, Agent, or Firm*—David V. Carlson; Harry K. Ahn; Seed and Berry LLP

[57] ABSTRACT

The current invention provides a timer circuit for timing a plurality of time periods. The timer circuit has a timing pulse input for receiving timing pulses; a set of state outputs being at a set of logic states, each logic state taking one of two logic values, the logic values of the set of logic states changing at each timing pulse; a plurality of timing outputs, each providing a signal at the expiry of a predetermined time period; and a resetting signal for resetting the timing circuit and for defining an initial set of logic states. The set of logic states follows a first sequence of sets of logic values, beginning at the initial set of logic values, wherein all of the logic states within each set are at a first logic value (1) except at least one logic state, which is at a second logic value (0), different state outputs carrying the excepted state(s) in each of the sets of logic values within the first sequence of sets of logic values.

A first timing signal generator generates a first timing signal to indicate the expiry of a first time period by detecting the first occurrence of the second logic value (0), in a subset of the set of logic states at the set of state outputs. A second timing signal generator generates a second timing signal to indicate the expiry of a second time period by detecting a predetermined combination of logic values at the set of state outputs.

24 Claims, 6 Drawing Sheets

5,606,584

TIMING CIRCUIT

TECHNICAL FIELD

The present invention concerns timer circuits for timing a plurality of time periods.

While the invention may be used in many applications, it has particular advantages when used in integrated circuit memory devices, notably those of the flash variety, having single transistor memory cells, each with a floating gate.

BACKGROUND OF THE INVENTION

FIG. 1 shows circuitry for controlling a flash memory cell. The memory cell 2 comprises a single transistor 4, having a control gate CG and a floating gate FG, a source S and a drain D. The source S is connected to a node 10, itself connected to a source voltage switch 14, which permits the source S to be connected either to a ground voltage $V_{GND}$, or to a programming voltage, $V_{pp}$, according to a signal applied to an erase control input 28. The drain D of transistor 4 is connected to a bit line 6, itself connected to a bit line switch 31, which permits bit line 6 to be connected either to a sense amplifier circuit 29 or to a programmable load circuit 32, according to a select control signal applied to a select input 21. The programmable load circuit 32 receives as input, load control signals 38. The sense amplifier circuit 29 provides an output to a data line 23. The control gate of transistor 4 is connected via word line 8 to a gate voltage switch 12. This gate voltage switch permits the control gate CG to be connected to the ground voltage $V_{GND}$, the programming voltage $V_{pp}$, or a supply voltage $V_{cc}$, according to control signals applied to program and erase control inputs 30, 28 respectively. $V'_{cc}$, is 5 V for a memory device operating with a 5 V supply, and about 5 V for a memory device operating with a 3 V supply.

The flash memory cell 2 has three modes of operation. In program mode, the floating gate FG is negatively charged, the transistor 4 becomes less conductive, and a 0 is considered to be written to the cell. In erase mode, the floating gate FG is discharged, the transistor 4 becomes more conductive. A 1 is then considered to have been written to the cell. In read mode, suitable voltages are applied to transistor 4 such that a relatively low current will flow when a 0 is written into the cell, and a relatively high current will flow when a 1 is written into the cell. The contents of each memory cell may thus be determined.

To select program mode, the program control signal 30 is set, causing the word line 8 and the control gate CG to be connected to the program voltage $V_{pp}$. The erase control signal 28 is not set, and the source S of transistor 4 is connected to the ground voltage $V_{GND}$ by source voltage switch 14. The select control signal 21 is set so as to connect the bit line 6 to the programmable load circuit 32. The load control signals 38 are set to place the drain D of transistor 4 at about 5 V.

This combination of bias voltages on transistor 4 causes the floating gate FG to become negatively charged. This changes the apparent threshold of the transistor, making it less conductive for a given control gate voltage. The charge accumulates during the time that the program control signal is set. A common method of achieving programming is to apply several pulses to the program control signal (program pulses), with a verify step in between each of them, to detect when the cell in question has been properly programmed.

In the erase mode, the erase control signal 28 is set to connect the control gate CG of the transistor 4 to the ground voltage $V_{GND}$, by means of gate voltage switch 12 and wordline 8. The source S is connected to the program voltage $V_{pp}$ by the source voltage switch 14 as controlled by the erase control signal 28. The select control signal 21 is set to control the bit line switch 31 to allow the bit line 6 to float at around 1 V. With these bias conditions, the charge on the floating gate FG reduces, the amount of charge removed depending on the duration of the erase control signal. This reduction in stored charge makes the cell more conductive. After a sufficient time, a 1 is written into the cell. A common way of achieving this erasure is to apply several pulses on the erase signal 28 (erase pulses), with a verify signal between each one to determine whether the erase is complete.

In read mode, neither the erase control signal 28 nor the program control signal 30 are active. This causes the control gate CG and the wordline 8 to be connected to the supply voltage $V'_{cc}$ by the gate voltage switch 12. The source of the transistor 4 is connected to ground $V_{GND}$ by the source voltage switch 14. Bit line 6 is connected to the sense amplifier circuit 29, which biases the bit line 6 to around 1 V. The amount of current flowing through the transistor 4 depends on its programmed or erased state. An erased cell will allow substantially more current to flow than a programmed cell. The sense amplifier 29 detects the level of the current through transistor 4, and places the bit line 23 in a logic state indicative of the state of the cell 2.

In a flash memory device, many cells such as that shown in FIG. 1 are connected together, and provided with addressing circuitry. Each cell, however, functions as described above, in its three possible states.

Within such circuits, it is necessary to measure several different time delays, each with equal accuracy. In the example of a flash EPROM memory circuit, very short time periods of the order of 10 µs may be needed for timing program pulses, whereas much longer periods, of the order of 10 ms may be needed for timing erase pulses.

A known circuit for timing both long and short time periods uses a linear feedback shift register (LFSR) in an autonomous mode, whereby the LFSR has no data inputs, and is supplied only with a clock signal. A LFSR is a shift register composed of a series of storage elements, such as D-type latches, wherein the outputs of certain latches are combined in a linear manner, and the resulting signal is applied to the input of a first latch.

The circuit is very similar to a normal shift register, except that a certain 'linear' function is introduced by including a linear element, for example an exclusive-OR or exclusive-NOR gate, in the circuit. Such gates pass or invert the output (Q) of one latch to the input (D) of the next depending on the output (Q) of another of the latches.

Linear feedback shift registers are discussed in "Digital Systems Testing and Testable Design", by Abramovici, Breuer and Friedman, Computer Science Press, 1990; "Shift Register Sequences", by S. W. Golomb, Aegean Park Press, 1982, and "Error Correcting Codes", Peterson & Weldon, MIT Press, 1972.

Typically, such LFSR timers are made from a loop comprising a series of latches, supplied with a clock signal input and no data input. This is called the autonomous mode of operation. By supplying a clock signal of sufficiently high frequency, for example 1 MHz, and detecting a certain combination of outputs of the latches, a range of periods such as described may be timed.

With a 1 MHz clock signal, a series of 14 latches are required to time the 10,000 clock cycles which constitute 10 ms.

FIG. 2 shows an LFSR timer comprising a number of digital storage devices, D0–D4 connected in a loop. Each digital storage device, which is typically a D-type latch, has a data input D, an output Q, an inverted output $\overline{Q}$, a clock input CK and a reset input R. Clock inputs CK and reset inputs R of the D-type latches are respectively connected together and receive timing pulse T and reset R signals respectively from external circuitry. The timing pulse signal T preferably consists of a series of pulses of constant frequency and width. Other types of pulses could, however, be used. The data input D of each D-type latch is connected to the output Q of the respectively preceding D-type latch, the data input of the first latch D0 being connected to the output of the last latch D4 by a feedback path 40, with the exception of the data input of D-type latch D2, which is connected to the output 42 of exclusive-NOR gate 44, which has two inputs 46, 48. The first input 46 is connected to the output Q1 of D-type latch D1, and the second input 48 is connected to the feedback path 40. The inverted and non-inverted outputs of D-type latch Dr. are designated $\overline{Q}$, Q respectively, and outputs of the other D-type latches are similarly designated.

The truth table of an exclusive-NOR gate with inputs A, B and output N is shown in Table 1.

TABLE 1

| A | B | N |
|---|---|---|
| 0 | 0 | 1 |
| 0 | 1 | 0 |
| 1 | 0 | 0 |
| 1 | 1 | 1 |

The exclusive-NOR gate 44 therefore outputs the inverse of one input (B; 46) when the other (A; 48) is at 0, and passes the first input (B; 46) when the other (A; 48) is at 1. Comparable functionality is obtained from including an exclusive-OR gate in the circuit instead of an exclusive-NOR. There may be any number of D-type latches in the loop.

By using the exclusive NOR gate in the loop, the data input to D-type latch D2 is the inverse of the output of D-type latch D1 whenever the output of D-type latch D4 is zero.

Applying a positive pulse to the reset input R to each of the D-type latches causes each of the D-type latches to be placed in the 0 output state.

Table 2 shows the sequence of outputs Q4 to Q0 from the D-type latches of the circuit of FIG. 2, during the clock cycles following a reset to zero of the D-type latches. For each clock cycle where a 0 is present at the output of Q4, the output of Q1 in the same cycle is inverted to become the output of Q2 in the following cycle. The sequence follows through all possible combinations, except '11111', before returning to its original state '00000', 31 clock cycles later, and resuming the same sequence. The state '11111' is excluded, as no change of state in the LFSR would occur with clocking. The LFSR would be stuck at this value. The circuit of FIG. 2 is thus a special case of LFSR, known as a maximal length shift register, at it cycles though all possible states, being $(2^n-1)$ in number, where n is the number of D-type latches. The positioning of the exclusive-NOR gate 44 in the circuit is critical to achieving a maximal length sequence, in this case 31 cycles.

TABLE 2

| Cycles after Reset | Q4 | Q3 | Q2 | Q1 | Q0 |
|---|---|---|---|---|---|
| 0 | 0 | 0 | 0 | 0 | 0 |
| 1 | 0 | 0 | 1 | 0 | 0 |
| 2 | 0 | 1 | 1 | 0 | 0 |
| 3 | 1 | 1 | 1 | 0 | 0 |
| 4 | 1 | 1 | 0 | 0 | 1 |
| 5 | 1 | 0 | 0 | 1 | 1 |
| 6 | 0 | 0 | 1 | 1 | 1 |
| 7 | 0 | 1 | 0 | 1 | 0 |
| 8 | 1 | 0 | 0 | 0 | 0 |
| 9 | 0 | 0 | 0 | 0 | 1 |
| 10 | 0 | 0 | 1 | 1 | 0 |
| 11 | 0 | 1 | 0 | 0 | 1 |
| 12 | 1 | 0 | 1 | 0 | 0 |
| 13 | 0 | 1 | 0 | 0 | 1 |
| 14 | 1 | 0 | 1 | 1 | 0 |
| 15 | 0 | 1 | 1 | 0 | 1 |
| 16 | 1 | 1 | 1 | 1 | 0 |
| 17 | 1 | 1 | 1 | 0 | 1 |
| 18 | 1 | 1 | 0 | 1 | 1 |
| 19 | 1 | 0 | 1 | 1 | 1 |
| 20 | 0 | 1 | 1 | 1 | 1 |
| 21 | 1 | 1 | 0 | 1 | 0 |
| 22 | 1 | 0 | 1 | 0 | 1 |
| 23 | 0 | 1 | 0 | 1 | 1 |
| 24 | 1 | 0 | 0 | 1 | 0 |
| 25 | 0 | 0 | 1 | 0 | 1 |
| 26 | 0 | 1 | 1 | 1 | 0 |
| 27 | 1 | 1 | 0 | 0 | 0 |
| 28 | 1 | 0 | 0 | 0 | 1 |
| 29 | 0 | 0 | 0 | 1 | 1 |
| 30 | 0 | 0 | 0 | 1 | 0 |

Were a loop of six D-type latches used, a series of 63 different combinations could have been produced, if the exclusive-NOR gate is placed correctly. Other loop sizes could also be chosen, according to the number of clock cycles required to be timed. For the example described above, to time 10 ms with a 1 MHz clock, 14 latches would be required, giving a maximal length of 16,383 cycles.

If an exclusive-OR gate were used instead of the exclusive-NOR, then for each clock cycle where a 1 is present at the output of Q4, the output of Q1 in the same cycle would be inverted to become the outpro of Q2 in the following cycle. The reset inputs to the D-type latches Dr. to D4 would also have to be arranged so that they reset to the 1 state upon application of the signal R, as the state '00000' is excluded, for the reason discussed above for the '11111' state in the case of an exclusive-NOR gate.

LFSR timers must detect a certain combination of outputs to determine the expiry of the required time period. With reference to Table 2, if the combination 00111 is detected, 6 clock cycles have elapsed since the reset to zero. Similarly, a combination of 01111 represents 20 clock cycles after the reset to zero. By providing a number of detectors, a number of periods may be timed, which can run concurrently from the reset to zero time. Equally, the time elapsed between two detections may be used as a measure of a period of time commencing after the reset to zero, or the counter may be reset to zero after each detection to time independent periods. Such detection requires the use of an n-bit detector for each timing period. A detector may simply be an n-input NAND gate, suitably connected. To detect the occurrence of '00000', a 5-input NAND is required, whose inputs are Q0, Q1, Q2, $\overline{Q3}$, $\overline{Q4}$. In the example given above, where 14 series latches are required to time both 10 ms and 1μs, two 14-input gates would be required, which would consume a large amount of surface area in an integrated circuit implementation.

A known method enables such LFSR circuits to measure very short periods of time, using simple one bit detectors, by including logic which effectively shorts out the linear (exclusive-OR or exclusive-NOR) function.

In FIG. 3, pass gates 50, 52 are included between the input to D-type latch D2 and: the output 42 of the exclusive NOR gate 44; and the output Q of the D-type latch D1, respectively. The pass gates are supplied with command signal SHORT and its inverse, $\overline{\text{SHORT}}$. The signal SHORT indicates that a short time delay is to be measured. A short delay may be defined as a time period lasting for a number of clock cycles which is less than the number of latches in the circuit. A time period lasting longer than this will be referred to as a 'long' period.

The pass gates 50, 52 serve to connect the data input D of D-type latch D2 to the output of the exclusive-NOR gate 44 when SHORT is low, and to connect the data input D of the D-type latch D2 to the output of D-type latch D1 when SHORT is high. An OR gate 53 is included in the feedback path 40, having a first input connected to the output of D4, and a second input receiving a signal RR, which is high at and following the application of reset signal R. Signal RR is reset to a low state at the first clock signal after the reset signal R becomes inactive.

FIG. 4 shows an alternative circuit for achieving the same result. The circuit is similar to that of FIG. 3 and identical features have identical reference labels. The reset and timing pulse signals R, T and the associated inputs to each of the latches D0 to D4 are omitted from the diagram for clarity, but should be understood as being included in the circuit as described above. The output 42 of the exclusive NOR gate 44 is connected to an input of NAND gate 54. The output Q1 of D-type latch D1 is connected to an input of NAND gate 56. The outputs of gates 54, 56 are connected to inputs of a further NAND gate, 58. A second input of gate 56 is connected to the signal SHORT; an inverter 60 receives SHORT on an input, and has its output connected to a second input of gate 54. When the signal SHORT is high, gate 56 is enabled, permitting the signal Q1 to be transmitted to the input D of D-type latch D2, via gate 58. The output 42 of the exclusive NOR gate 44 is not transmitted, as gate 54 is held in a high state by a low on its second input. Conversely, when SHORT is low, the output 42 of gate 44 is transmitted via gate 58 to D2, whereas the output Q1 of latch D1 is not transmitted, the gate 56 being held at a high state by the low on its second input.

Thus, by setting SHORT high, the exclusive-NOR gate is excluded from the circuit, removing the linear element and causing the circuits of FIGS. 3 and 4 to function as a normal shift register which may be used for timing very short delays. By setting the contents of the register to 00001, and detecting the transition 0 to 1 at Q4, when the LFSR holds 10000, a period of four cycles may be measured, using a single bit detector.

The contents of the LFSR may be set to 00001 by applying an active reset pulse R to the reset inputs of the D-type latches, and an active signal RR to the second input of OR gate 53.

By setting SHORT low, periods of up to 31 cycles may be measured as described above. This method has the advantage that short time delays need only a single bit detection circuit, but have the drawback that the extra logic circuitry required for operating the two different modes occupies a relatively large surface area. Further, using the circuit in the short delay mode, only short periods may be measured. If both a short delay and a long delay need to be measured concurrently, beginning at the same reset, this circuit cannot be used. This solution applies to cases where several short timings need to be made, as the additional logic circuitry is made up for in the savings made by using smaller decoders.

The object of the current invention is to provide a timing circuit for timing a plurality of time periods without adding to the complexity of the timer circuit.

SUMMARY OF THE INVENTION

The invention provides a timer circuit having: a timing pulse input for receiving timing pulses; a set of state outputs each providing a logic states at one of two logic values, the logic values of the set of logic states changing at each timing pulse; a plurality of timing outputs, each providing a signal at the expiry of a predetermined time period; and a resetting signal for resetting the timing circuit and for defining an initial set of logic states. The counter has the set of logic states following a first sequence of sets of logic values, beginning at the initial set of logic values, wherein all of the logic states within each set are at a first logic value except at least one logic state, which is at a second logic value, different state outputs carrying the excepted state(s) in each of the sets of logic values within the first sequence of sets of logic values. A first timing signal generator generates a first timing signal at one of the timing outputs to indicate the expiry of a first time period by detecting the first occurrence of the second logic value at a predetermined subset of the of state outputs, while a second timing signal generator generates a second timing signal at another of the timing outputs to indicate the expiry of a second time period by detecting a predetermined combination of logic values at the set of state outputs.

Each timing signal generator may further be connected to receive an enable signal to enable the timing signal generator, the timing signal being produced from a timing signal generator only when the corresponding enable signal is active.

In a particular embodiment of the invention, all logic states within each set of the first sequence of sets are at a first logic value, except only one logic state, which is at a second logic value, and the subset of the set of logic states at the set of state outputs comprises one predetermined state output.

Timing circuits according to the invention may advantageously be integrated into a semiconductor memory device, the timing outputs signaling the expiry of time periods required for the programming and erasure of memory cells within the semiconductor memory device. Such an arrangement is particularly advantageous where the semiconductor memory device is a flash EPROM memory device, and the time periods are erase pulse durations and program pulse durations.

Such a timing circuit is provided, which contains a loop, comprising a plurality of digital storage devices, each receiving an input at its data input in addition to receiving timing pulses and the reset signal, and each providing an output which is connected to the data input of the following digital storage device, with the exception of one digital storage device, whose data input is connected to an output of a linear element, the linear element being connected so as to supply at its output a signal which has a linear relationship with a plurality of outputs of digital storage devices in the loop; the outputs comprising the state outputs of the timing circuit.

The linear element may supply at its output a signal which has an exclusive-OR or exclusive-NOR logical relationship with the plurality of outputs of the digital storage devices.

The first sequence of sets may comprise a number of sets which is one less than the number of digital storage devices in the loop.

Preferably, each digital storage device further provides an inverted output, selected outputs and inverted outputs of the digital storage devices being connected to the first and second timing signal generators. The digital storage devices may be D-type latches.

A method for timing a plurality of time periods is also provided, comprising the steps of:

enabling a first timing signal generator;

setting a circuit including a plurality of digital storage devices, having a set of state outputs at a set of logic states, each state taking one of two logic values, to an initial set of logic values, the initial set of logic values being a first set of a first sequence of sets of logic values, each set of logic values within such first sequence of sets of logic values comprising all logic states at a first logic value, except at least one logic state, which is at a second logic value;

applying timing pulses to the circuit to cause the set of logic states to change to subsequent sets of logic values within the first sequence of sets of logic values;

detecting the first occurrence of the second logic value in a subset of the set of logic states, during the first sequence of sets of logic values;

indicating the expiry of a first time period by the provision of a first timing signal by the first timing signal generator;

enabling a second timing signal generator;

applying timing pulses to the circuit to cause the set of logic states to change to subsequent sets of logic values within and beyond the first sequence of sets of logic values;

detecting the occurrence of a certain set of logic values, not within the first sequence of sets of logic values at the set of logic states;

indicating the expiry of a second time period by the provision of a second timing signal by the second timing signal generator.

The method of timing may particularly be applied to timing erase and programming pulses in a semiconductor memory device, comprising the steps of:

enabling a first timing signal generator;

supplying a reset signal at the time that a programming pulse is to start;

applying the reset signal to a circuit including a plurality of digital storage devices, having a set of state outputs at a set of logic states, each taking one of two logic values, to set the circuit to an initial set of logic values, being a first set of a first sequence of sets of logic values, each set of logic values within such first sequence of sets comprising all logic states at a first logic value, except at least one logic state, which is at a second logic value;

applying a programming signal to memory cells of the semiconductor memory device to be programmed;

applying timing pulses to the circuit to cause the set of logic states to change to subsequent sets of logic values within the first sequence of sets of logic values;

detecting the first occurrence of the second logic value in a predetermined subset of the set of logic states, during the first sequence of sets of logic values;

indicating the expiry of a first time period, by the provision of a first timing signal from the first timing signal generator;

removing the programming signal from the cells of the semiconductor memory device to be programmed;

enabling a second timing signal generator;

supplying a reset signal at the time that an erase pulse is to start;

applying the reset signal to the circuit including a plurality of digital storage devices to place them in the known set of states;

applying an erase signal to memory cells within the semiconductor memory device to be erased;

applying timing pulses to the circuit to cause the set of logic states to change to subsequent sets of logic values within and beyond the first sequence of sets of logic values;

detecting the occurrence of a certain set of logic values, not within the sequence of sets of logic values, at the set of state outputs;

indicating the expiry of a second time period by the provision of a second timing signal by the second timing signal generator;

removing the erase signal from the memory cells of the semiconductor memory device to be erased.

The current invention provides a circuit which may time several differ periods consecutively or concurrently, chosen from a number of periods, both long short, which are continually available, the periods available being easily changeable.

Particular embodiments of the invention will be described hereinafter, way of example, in conjunction with the accompanying diagrams.

DETAILED DESCRIPTION OF THE INVENTION

Provided that they are suitably designed, and initiated into an appropriate state, LFSRs may have the characteristic that they operate in a manner similar to that of a normal shift register, over a limited number of clock cycles.

Figure 1:
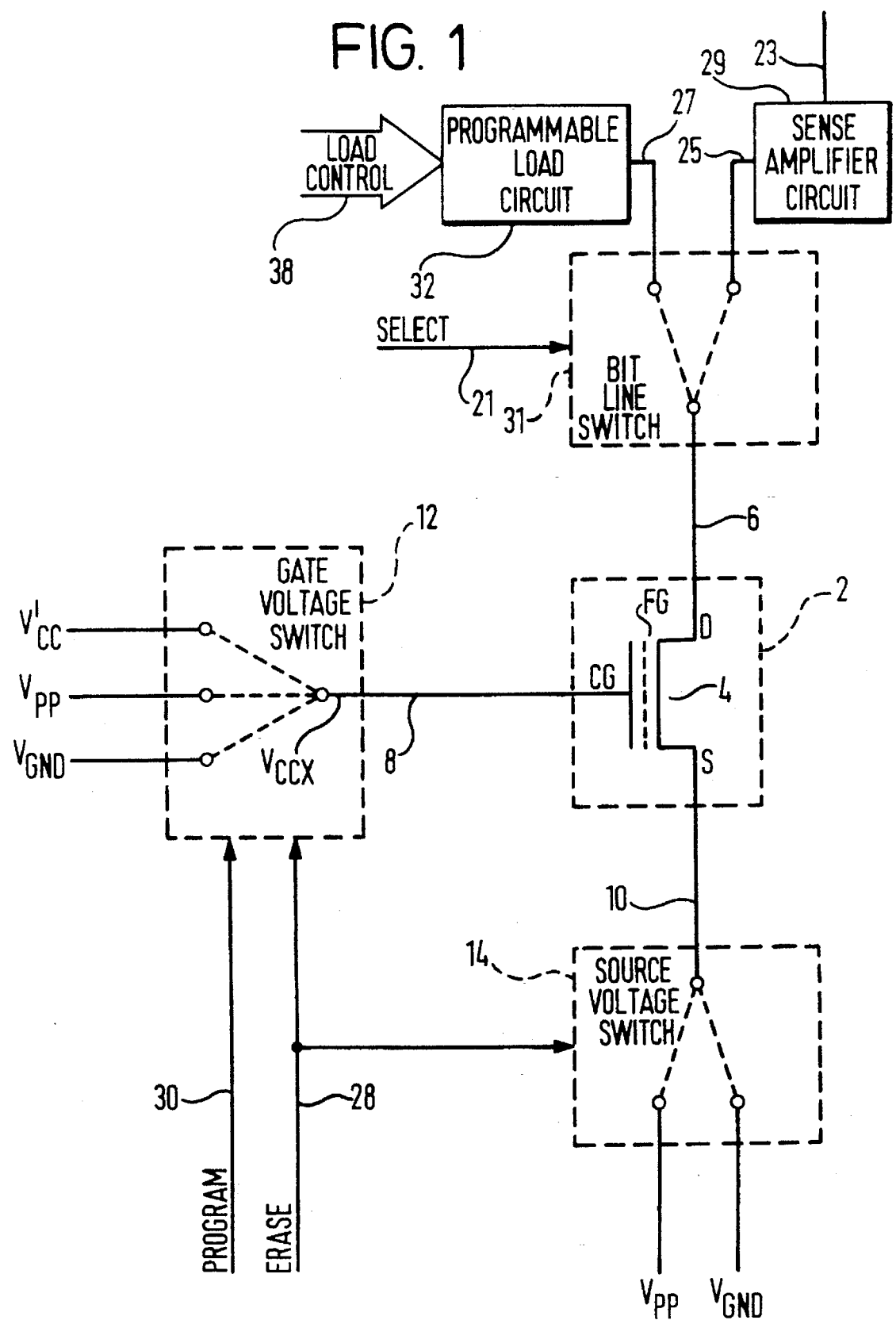
FIG. 1 shows a circuit diagram of a flash memory circuit.
Figure 2:
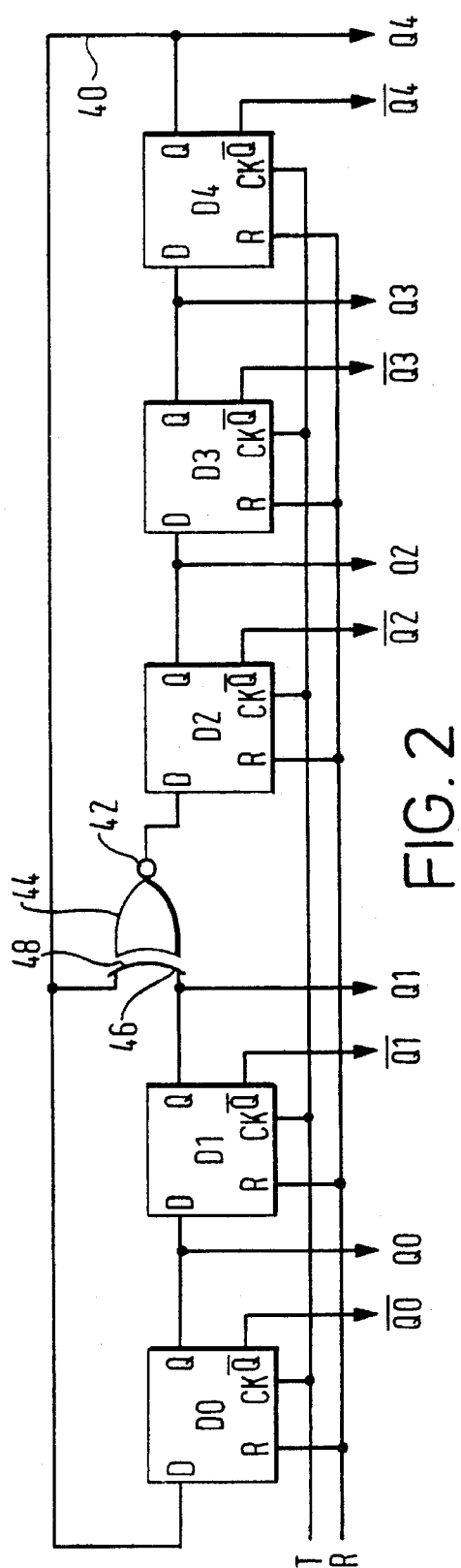
FIG. 2 shows a circuit diagram of a linear feedback shift register of the prior art.
Figure 3:
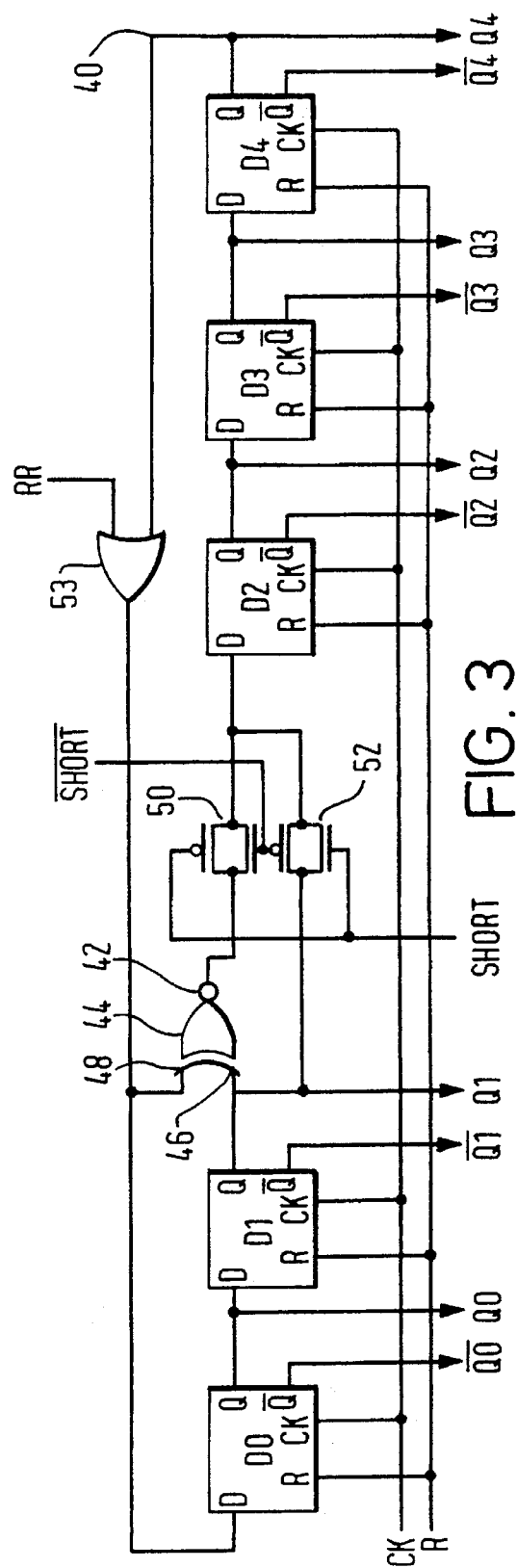
FIG. 3 shows a linear feedback shift register of the prior art, operable in both short and long delay modes.
Figure 4:
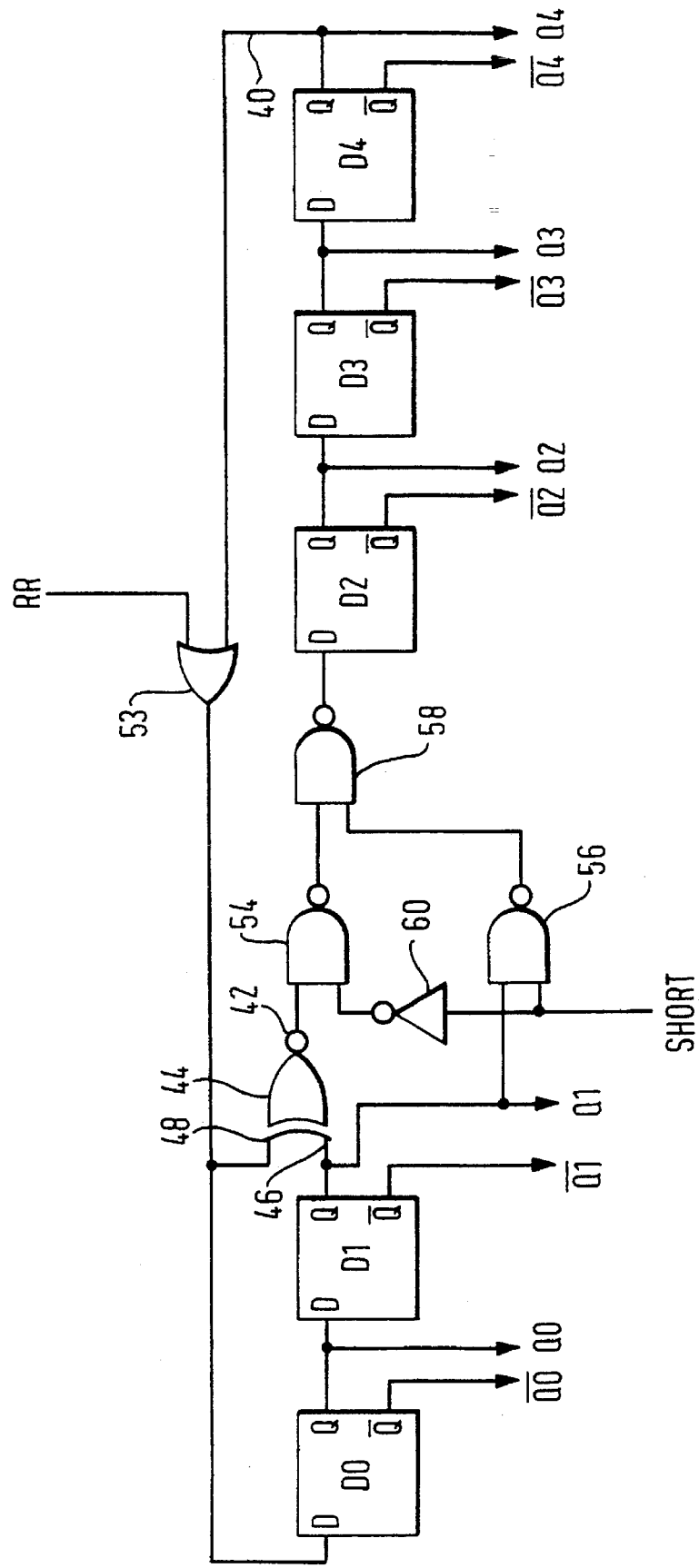
FIG. 4 shows another linear feedback shift register of the prior operable in both short and long delay modes.

Table 2 lists the outputs Q0 to Q4 for the latches D0 to D4 for a full cycle of a maximal length, 5 stage, LFSR such as that shown in FIG. 2. Referring to this table during the time from 16 clock cycles after the reset to zero until 20 cycles after the reset to zero, the LFSR acts as a normal shift register, rotating 11110 until 01111 is achieved.

If means be provided for setting all of the D-type latches to any chosen state, use may be made of this property to time short delays.

Figure 5:
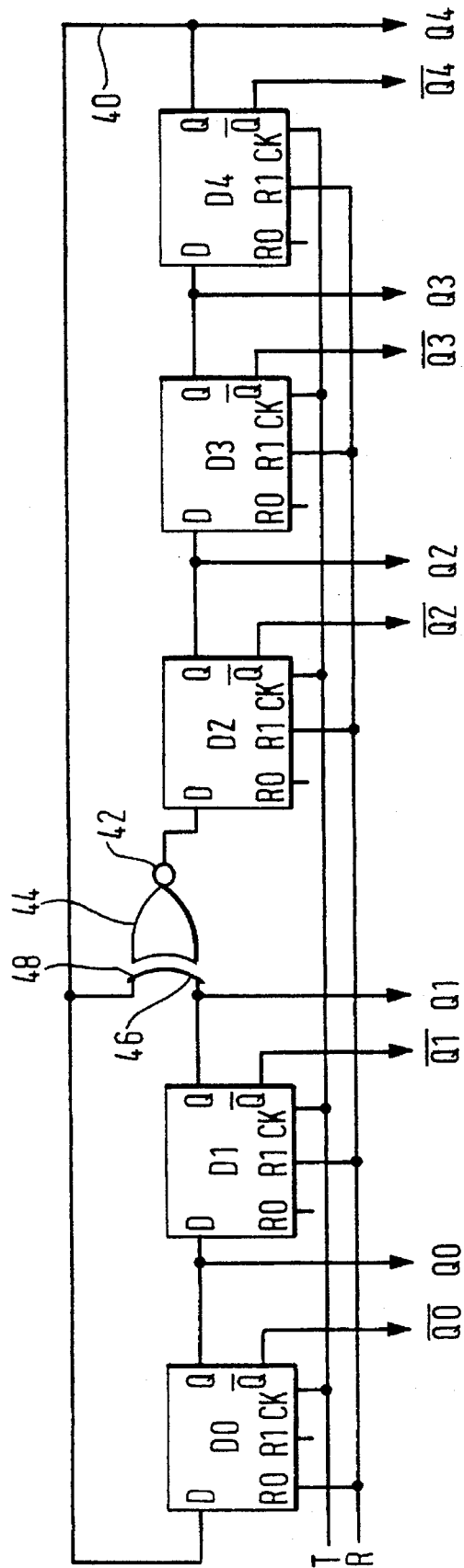
FIG. 5 shows a circuit according to the present invention.

Table 3 shows the outputs of the LFSR of FIG. 5 during a certain number of clock cycles after it has been initialized to contain 11110. The contents rotate left in the same manner as a normal shift register, until the LFSR contains 01111, four clock cycles later. Afterwards, the LFSR continues on its specific sequence.

TABLE 3

| Cycles after Reset | Q4 | Q3 | Q2 | Q1 | Q0 |
|---|---|---|---|---|---|
| 0  | 1 | 1 | 1 | 1 | 0 |
| 1  | 1 | 1 | 1 | 0 | 1 |
| 2  | 1 | 1 | 0 | 1 | 1 |
| 3  | 1 | 0 | 1 | 1 | 1 |
| 4  | 0 | 1 | 1 | 1 | 1 |
| 5  | 1 | 1 | 0 | 1 | 0 |
| 6  | 1 | 0 | 1 | 0 | 1 |
| 7  | 0 | 1 | 0 | 1 | 1 |
| 8  | 1 | 0 | 0 | 1 | 0 |
| 9  | 0 | 0 | 1 | 0 | 1 |
| 10 | 0 | 1 | 1 | 1 | 0 |
| 11 | 1 | 1 | 0 | 0 | 0 |
| 12 | 1 | 0 | 0 | 0 | 1 |
| 13 | 0 | 0 | 0 | 1 | 1 |
| 14 | 0 | 0 | 0 | 1 | 0 |
| 15 | 0 | 0 | 0 | 0 | 0 |
| 16 | 0 | 0 | 1 | 0 | 0 |
| 17 | 0 | 1 | 1 | 0 | 0 |
| 18 | 1 | 1 | 1 | 0 | 0 |
| 19 | 1 | 1 | 0 | 0 | 1 |
| 20 | 1 | 0 | 0 | 1 | 1 |
| 21 | 0 | 0 | 1 | 1 | 1 |
| 22 | 0 | 1 | 0 | 1 | 0 |
| 23 | 1 | 0 | 0 | 0 | 0 |
| 24 | 0 | 0 | 0 | 0 | 1 |
| 25 | 0 | 0 | 1 | 1 | 0 |
| 26 | 0 | 1 | 0 | 0 | 0 |
| 27 | 1 | 0 | 1 | 0 | 0 |
| 28 | 0 | 1 | 0 | 0 | 1 |
| 29 | 1 | 0 | 1 | 1 | 0 |
| 30 | 0 | 1 | 1 | 0 | 1 |

By detecting a 0 at the output Q3, a period of 3 cycles after reset may be timed. Longer periods may be timed by detecting a specific combination of outputs in the sequence of the LFSR used. With a 5 bit LFSR, a maximum of 31 periods may be measured, but this will depend on the particular design of the LFSR used: many possible designs are non-exhaustive, and cycle through sequences of less than the maximal number ($2^n-1$) of states.

For the LFSR of FIG. 5, and with reference to Table 3, a long period of, for example, 17 clock cycles may be timed by detecting 01100 in the outputs of the LFSR. An n-bit detector is required to detect the end of long periods.

Thus, any short delays may be timed with a single bit detector, while long periods require a multiple bit detector.

FIG. 5 shows an LFSR circuit according to the invention. Features similar to those of FIG. 2 have similar reference labels. Each of the D-type latches D0 to D4 has two reset inputs, $R_0, R_1$. The output of each latch is set to 0 when a positive pulse is applied to the $R_0$ input, and the output of each latch is set to 1 when a positive pulse is applied to the $R_1$ input. The reset input signal R is connected to the input $R_1$ of D-type latches D1 to D4, and to the $R_0$ input of the D-type latch D0. By applying a positive pulse on the reset signal R, the outputs of the latches are set to '11110', and by applying a clock signal CK, the LFSR will go through the sequence of states listed in Table 3.

Figure 6:
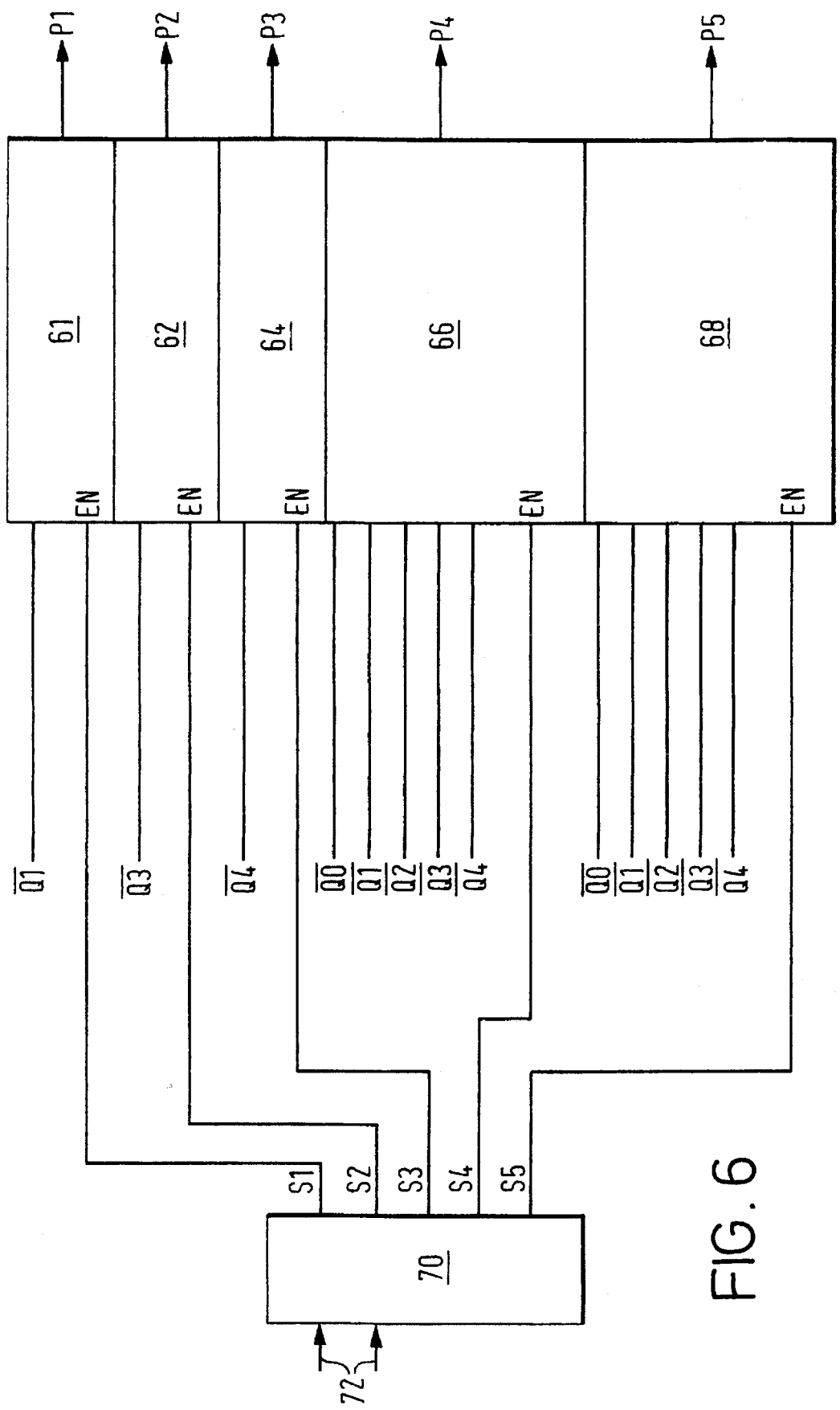
FIG. 6 shows detection circuitry according to the present invention.

FIG. 6 shows detection circuitry connectable to the LFSR of FIG. 5 to detect the expiry of the required delays. Five detectors 61, 62, 64, 66, 68, have inputs connected to selected ones of the inverted and non-inverted outputs of the LFSR. Each detector has an enable input EN and an outpro P1–P5. An enable signal generator circuit 70 is commanded by signals 72 from external circuitry to generate enable signals S1–S5, connected to the enable inputs EN of detectors 61, 62, 64, 66, 68, respectively. Each detector supplies an output P1, P2, P3, P4, P5, respectively.

Each detector is arranged to detect a certain combination of LFSR outputs, by the combination of inverted and non-inverted LFSR outputs $\overline{Q}$, Q applied thereto. Selection of which enable signal is active thus selects which combination of inverted and non-inverted outputs will be detected, and hence which period is timed. The enable signal should be active from the time that the LFSR is reset, and begins timing. In the example, when all inputs $\overline{Q}$, Q to the enabled detector are high, the detector supplies an output P indicating that the selected time period has elapsed.

Detector 61 produces an output signal P1 when its input $\overline{Q1}$ is 1, i.e. one cycle after reset, or after an elapsed period of 1 μs, with a 1MHz clock. Similarly, detector 62 produces an output signal P2 when its input Q3 is 1, i.e. three cycles after reset, or after an elapsed period of 3 μs; detector 64 produces an output signal P3 when its input $\overline{Q4}$ is 1, i.e. four cycles after reset, or after an elapsed period of 4 μs; detector 66 produces an output signal P4 when its inputs $\overline{Q1}$, $\overline{Q2}$, $\overline{Q3}$, Q4 are 11111, i.e. twenty-three cycles after reset, or after an elapsed period of 23 μs; detector 68 produces an output signal P5 when its inputs $\overline{Q0}$, 1, $\overline{Q2}$, $\overline{Q3}$, Q4, are 11111, i.e. eight cycles after reset, or after an elapsed period of 8 μs. Thus, timing periods up to a number of clock cycles equal to one less than the number of digital storage elements requires a short 20 period (single bit) detector, and other (long) periods require an all bit detector.

The periods timed may easily be defined and changed by selecting different inverted and non-inverted outputs $\overline{Q}$, Q connected to each of the short and long period detectors.

Detectors 61, 62, 64 are short period detectors, and each receive only one inverted LFSR output $\overline{Q1}$, $\overline{Q3}$, $\overline{Q4}$, respectively. They detect the transition of the connected D-type latch output $\overline{Q}$ from 0 to 1, to time periods of 1, 3 and 4 clock cycles respectively. The output P1, P2, P3 of each short period detector will produce an output upon the expiry of the relevant time period, provided that the relevant enable input EN is activated by the associated enable signal S1, S2, S3.

It is possible to time concurrent periods, by placing more than one enable signal in its active state. In this case, care must be taken to ensure that the short period detectors only respond to the first transition on their input. For example, and with reference to Table 3, if both the 3 μs period detector 62 and the 8 μs period detector 68 are enabled, then the short period detector 62 must only respond to Q3=0 at 3 cycles after reset, and not those at 6 and 8 cycles after reset. This may be achieved by simply including a latch either before or within the short period detectors and providing it with the reset pulse of the LFSR to permit a single input.

Figure 7:
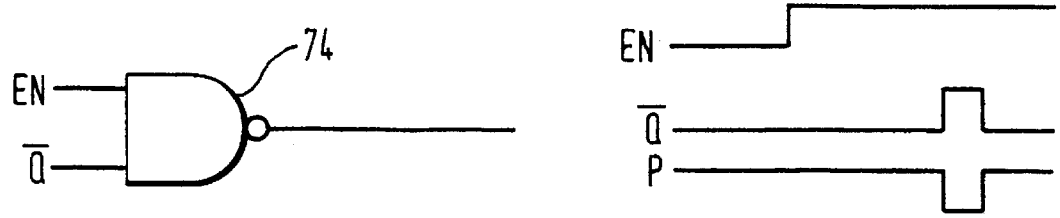
FIGS. 7 and 8 show further detection circuitry according to the present invention.

As shown in FIG. 7, a short period detector 61, 62, 64 may be a two input NAND gate 74. The application of EN=1 (an active enable signal) and $\overline{Q}$=1 (which, when high, indicates the expiry of the timed period) on the inputs supplies a low output P for a single cycle. This low pulse may be applied to a latch or a state machine or any other memory or control circuitry required according to the particular application.

Detectors 66, 68 detect long periods. They each receive an output Q or $\overline{Q}$ from each of the D-type latches Dr. to D4. These outputs may be inverted $\overline{Q}$ or non-inverted Q according to the combination to be detected. When all of the inputs Q, Q to one particular long delay detector are high, and the enable input EN is activated by the relevant enable signal S4, S5, the output P4, P5 of that-particular long delay detector changes state to indicate the expiry of the timed delay.

Figure 8:
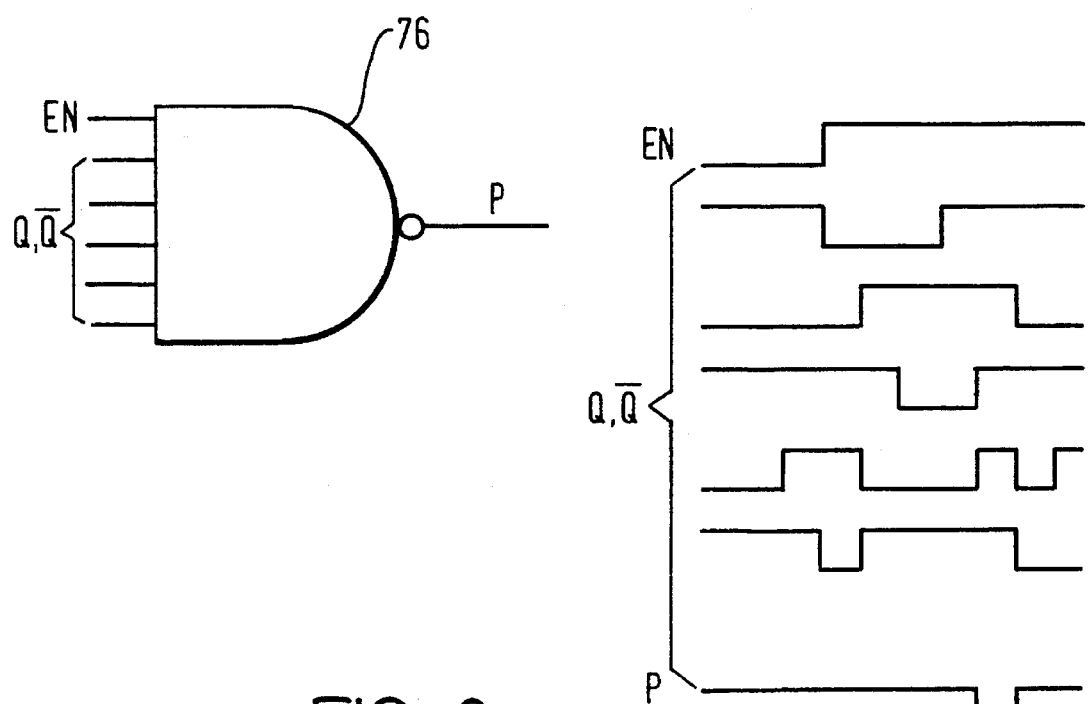

FIG. 8 shows a possible implementation of such detectors. A multiple input NAND gate 76 receives the outputs Q, $\overline{Q}$ from the D-type latches D0 to D4, and supplies an output signal P. This NAND gate has six inputs in the example, and this gate is more complex and much larger than the two-input NAND gate used for the short 20 period detector.

The enable signal EN is active as described for the short period detector. The output P is normally high, going low for one clock period when the timed period has elapsed. The elapsing of the timed period corresponds to the instant when all inputs Q, $\overline{Q}$ are high to the appropriate detectors 61, 62, 64, 66, and 68.

The number of inputs required to the NAND gate 76 is equal to the number of storage elements in the LFSR, plus one for the enable signal EN. To provide a long period detector for a 14 stage LFSR would require a fifteen-input NAND gate, which is very large.

According to the invention, therefore, both a 10 μs and a 10 ms period may be timed from a 1 MHz clock using an LFSR containing 14 digital storage elements, and requiring one fourteen-bit decoder and one one-bit decoder. The benefits of being able to detect the expiry of short periods by detecting a transition on only one LFSR output thus saves a large amount of circuit area when the circuit is implemented as an integrated circuit. A saving in circuit complexity is also made. In addition, long and short periods of different duration may be simultaneously detected, if desired, by use of multiple detectors having the desired inputs, one example being shown in FIG. 6.

By using D-type latches having both reset-to-zero and reset-to-one inputs, the invention fulfills its object by providing a circuit for detecting both short and long time delays using a linear feedback shift register, with no additional circuitry, and minimum sized detection circuitry for short delays, representing a significant saving in surface area over previously known designs, when implemented as an integrated circuit.

Although the invention has been described with reference to a number of particular embodiments, it will be understood that the invention applies to any LFSR, not necessarily having a maximal length sequence, and including any appropriate linear element and operated at different, usually higher clock frequencies than 1 MHz.

I claim:

1. A timing circuit for timing a plurality of time periods, the timing circuit comprising:

a timing pulse input for receiving timing pulses;

a set of state outputs each providing a logic state at one of two logic values, the logic values of the set of logic states changing at each timing pulse;

a plurality of timing outputs, each providing a signal at the expiry of a predetermined time period;

a resetting signal for resetting the timing circuit and for defining an initial set of logic states, characterised in that the set of logic states follows a first sequence of sets of logic values, beginning at the initial set of logic values, wherein all of the logic states within each set are at a first logic value except at least one logic state, which is at a second logic value, different state outputs carrying the excepted state(s) in each of the sets of logic values within the first sequence of sets of logic values;

a first timing signal generator for generating a first timing signal at one of said timing outputs to indicate the expiry of a first time period by detecting the first occurrence of the second logic values at a predetermined subset of said state outputs; and a second timing signal generator for generating a second timing signal at another of said timing outputs to indicate the expiry of a second time period by detecting a predetermined combination of logic values at the set of state outputs.

2. A timing circuit according to claim 1 wherein each timing signal generator is further connected to receive an enable signal to enable the timing signal generator, the timing signal being produced from a timing signal generator only when the corresponding enable signal is active.

3. A timing circuit according to claim 1 wherein all logic states within each set of the first sequence of sets are at a first logic value, except only one logic state, which is at a second logic value, and the subset of the set of logic states at the set of state outputs comprises one predetermined state output.

4. A timing circuit according to claim 1 integrated into a semiconductor memory device, the timing outputs signalling the expiry of time periods required for the programming and erasure of memory cells within the semiconductor memory device.

5. A timing circuit according to claim 4 wherein the semiconductor memory device is a flash EPROM memory device, and the time periods are erase pulse durations and programming pulse durations.

6. A timing circuit according to claim 1, further comprising a loop, having a plurality of digital storage devices, each receiving a data input in addition to the timing pulses and the reset signal, and each providing an output which is connected to the data input of the following digital storage device, with the exception of one digital storage device, whose data input is connected to an output of a linear element, the linear element being connected so as to supply at its output a signal which has a logical relationship with a plurality of outputs of digital storage devices in the loop, the outputs comprising the state outputs of the timing circuit.

7. A timing circuit according to claim 6 wherein the linear element supplies at its output a signal which has an exclusive-OR logical relationship with the plurality of outputs of the digital storage devices.

8. A timing circuit according to claim 6 wherein the linear element supplies at its output a signal which has an exclusive-NOR logical relationship with the plurality of outputs of the digital storage devices.

9. A timing circuit according to claim 6 wherein the first sequence of sets comprises a number of sets which is one less than the number of digital storage devices in the loop.

10. A timer circuit according to claim 5 wherein each digital storage device further provides an inverted output, selected outputs and inverted outputs of the digital storage devices being connected to the first and second timing signal generators.

11. A timing circuit according to claim 6 wherein the digital storage devices are D-type latches.

12. A method for timing a plurality of time periods, comprising the steps of:

enabling a first timing signal generator;

setting a circuit including a plurality of digital storage devices, having a set of state outputs at a set of logic states, each state taking one of two logic values, to an initial set of logic values, said initial set of logic values being a first set of a first sequence of sets of logic values, each set of logic values within such first sequence of sets of logic values comprising all logic states at a first logic value, except at least one logic state, which is at a second logic value;

applying timing pulses to the circuit to cause the set of logic states to change to subsequent sets of logic values within the first sequence of sets of logic values;

detecting the first occurrence of the second logic value in a predetermined subset of the set of logic states, during the first sequence sets of logic values;

indicating the expiry of a first time period by the provision of a first timing signal by the first timing signal generator enabling a second timing signal generator;

detecting the occurrence of a certain set of logic values, not within the first sequence of sets of logic values at the set of logic states; and indicating the expiry of a second time period by the provision of second timing signal by the second timing signal generator.

13. A method of timing erase and programming pulses in a semiconductor memory device, comprising the steps of enabling a first timing signal generator;

supplying a reset signal at the time that a programming pulse is to start;

applying the reset signal to a circuit including a plurality of digital storage devices, having a set of state outputs at a set of logic states, each taking one of two logic values, to an initial set of logic values, being a first set of a first sequence of sets of logic values, each set of logic values within such first sequence of sets comprising all logic states at a first logic value, except at least one logic state, which is at a second logic value;

applying a programming signal to memory cells of the semiconductor memory device to be programmed;

applying timing pulses to the circuit to cause the set of logic states to change to subsequent sets of logic values within the first sequence of sets of logic values;

detecting the first occurrence of the second logic value in a predetermined subset of the sets of logic states, during the first sequence of sets of logic values;

indicating the expiry of a first time period, by the provision of a first timing signal from first timing signal generator;

removing the programming signal from the cells of the semiconductor memory device to be programmed;

enabling a second timing signal generator;

supplying a reset signal at the time that an erase pulse is to start;

applying the reset signal to the circuit including a plurality of digital storage devices to place them in the known set of states;

applying an erase signal to memory cells within the semiconductor memory device to be erased;

applying timing pulses to the circuit to cause the set of logic states to change to subsequent sets of logic values within and beyond the first sequence of sets of logic values;

detecting the occurrence of a certain set of logic values, not within the first sequence of sets of logic values, at the set of state outputs;

indicating the expiry of the a second time period by the provision of a second timing signal by the second timing signal generator; and removing the erase signal from the memory cells of the semiconductor memory device to be erased.

14. A memory device comprising:

a plurality of nonvolatile memory cells having at least first and second modes of operation, first mode operations being performed with first pulses, each of the first pulses having a duration of a first time period, second mode operations being performed with second pulses, each of the second pulses having a second time period longer than the first time period;

a timing register inputting timing pulses and outputting a set of state outputs, each state output in the set of state outputs having one of a first and second logic value, the set of state outputs changing at each timing pulse, said timing register also inputting a reset signal for resetting said register and for defining an initial set of state outputs, the set of state outputs following a first sequence of sets of state outputs wherein at least one state output in each set of state outputs has the second logic value and all other state outputs in the set have the first logic value;

a first detector for generating a first timing signal to indicate the end of the first time period by detecting the first occurrence of the second logic value at a predetermined subset of the set of state outputs; and a second detector for generating a second timing signal to indicate the end of the second time period by detecting a predetermined combination of logic values at the set of state outputs.

15. The memory device of claim 14 wherein said first and second detectors input first and second enable signals such that said first and second detectors generate the first and second timing signals only when the first and second enable signals are active.

16. The memory device of claim 14 wherein the memory device is a flash EPROM, the first mode of operation is a programming mode, and the second mode of operation is an erasing mode.

17. The memory device of claim 14, further comprising a loop of digital storage elements, each of said storage elements inputting the timing pulses and the reset signal and outputting an output signal, the output signal being input into a data input of a next storage element in said loop of storage elements, the output of an excepted storage element in said loop being input into a logic gate, an output of the logic gate being input into the data input of the next storage element associated with the excepted storage element.

18. The memory device of claim 17 wherein the logic gate is an exclusive NOR gate.

19. The memory device of claim 17 wherein the logic gate is an exclusive OR gate.

20. The memory device of claim 17 wherein said digital storage elements comprise D-type latches.

21. A method of timing operational pulses in a memory device, the method comprising the steps of:

applying a first operational pulse having a duration of a first time period to memory cells in the memory device;

changing a shift register's set of state outputs with first and second logic values from an initial set of state outputs, the initial set of state outputs being a first set of a first sequence of sets of state outputs, each set of state outputs within the first sequence of sets of state outputs having at least one state output at the second logic value and all other state outputs in the set at the first logic value, to subsequent sets of state outputs in the first sequence of sets of state outputs;

detecting a first occurrence of the second logic value in a predetermined subset of the set of state outputs during the first sequence of sets of state outputs;

indicating an end of the first time period;

removing the first operational pulse from the memory cells;

applying a second operational pulse having a duration of a second time period longer than the first time period to memory cells;

changing the set of state outputs to subsequent sets of state outputs in the first sequence of sets of state outputs and in further sequences of sets of state outputs;

detecting a first occurrence of a predetermined set of logic values in the further sequence of sets of state outputs;

indicating an end of the second time period; and removing the second operational pulse from the memory cells.

22. The method of claim 21 wherein said step of applying a first operational pulse applies a programming pulse.

23. The method of claim 21 wherein said step of applying a second operational pulse applies an erase pulse.

24. The method of claim 21 wherein said step of indicating an end of the first time period comprises the step of providing a first timing signal from a first timing signal generator; and said step of indicating an end of the second time period comprises the step of providing a second timing signal from a second timing signal generator.

* * * * *